United States Patent [19]
Maki et al.

[11] Patent Number: 5,652,517
[45] Date of Patent: Jul. 29, 1997

[54] MAGNET ASSEMBLY FOR MRI APPARATUS

[75] Inventors: Kazutoshi Maki; Yuji Inoue; Naoki Nakamura, all of Tokyo, Japan

[73] Assignee: GE Yokogawa Medical Systems, Limited, Tokyo, Japan

[21] Appl. No.: 650,083

[22] Filed: May 17, 1996

[51] Int. Cl.$^6$ .................................................. G01V 3/00
[52] U.S. Cl. ................................... 324/318; 324/319
[58] Field of Search ............................ 324/315, 318, 324/319, 320, 322; 335/299, 300

[56] References Cited

U.S. PATENT DOCUMENTS

| | | | |
|---|---|---|---|
| 4,663,592 | 5/1987 | Yamaguchi et al. | 324/315 |
| 5,397,987 | 3/1995 | Garritano | 324/315 |

FOREIGN PATENT DOCUMENTS

| | | | |
|---|---|---|---|
| 63-278310 | 11/1988 | Japan | 324/315 |

Primary Examiner—Louis M. Arana
Attorney, Agent, or Firm—Moonray Kojima

[57] ABSTRACT

The invention improves thermal efficiency and control follow-up properties by providing an AC sheet heater and a DC sheet heater on the respective side surfaces of an upper base yoke and a lower base yoke, and a temperature sensor near the center of the upper surface of the upper base yoke, whereby the permanent magnets of the magnet assembly are first heated by use of both the AC and DC sheet heaters, and then, with the temperature monitored by the temperature sensor, the temperature is adjusted by use of only the DC sheet heater.

9 Claims, 3 Drawing Sheets

MAGNET ASSEMBLY FOR MRI APPARATUS

BACKGROUND OF THE INVENTION

The present invention relates to a magnet assembly suitable for use in an MRI (Magnetic Resonance Imaging) apparatus, and more specifically to a magnet assembly for an MRI apparatus, which is capable of suitably suppressing the influence of temperature on a static magnetic field.

Conventional techniques according to MRI apparatus, for suppressing the influence of temperature on static magnetic fields have been disclosed in Japanese Patent Application Laid-Open Nos. 63-43649 and 63-278310, for example.

According to the MRI apparatus disclosed in Japanese Patent Application Laid-Open No. 63-43649, a heat insulating material is placed on an inner wall of an enclosure for integrally covering a lower base yoke, columnar yokes and an upper base yoke so that they are thermally cut off from the surroundings. Further, an air flow path is defined between each yoke and the heat insulating material so that air is allowed to forcedly flow therethrough by a fan. Furthermore, the temperature of the air is adjusted by a temperature adjusting heater and a temperature sensor.

According to the MRI apparatus disclosed in Japanese Patent Application Laid-Open No. 63-278310, sheet-like startup heaters are respectively placed on an upper surface of an upper base yoke and a lower surface of a lower base yoke. Upon startup of the MRI apparatus, the yokes are heated by the startup heaters. After startup of the MRI apparatus, the startup heaters are de-energized and the temperature of air existing around the yokes is adjusted by a temperature adjusting heater and a temperature sensor just in the same as the MRI apparatus disclosed in Japanese Patent Application Laid-Open No. 63-43649.

Both the cases of the two prior arts, the yokes are surrounded by the heat insulating material. The air flow path is defined between the yokes and the heat insulating material so that the air is allowed to forcedly flow therethrough by a fan. Further, the temperature of the air flowing through the air flow path is adjusted by the temperature adjusting heater and the temperature sensor to provide steady temperature control, whereby the influence of temperature on the static magnetic field is suppressed.

However, a problem arises that since the yokes are heated via the air, the efficiency is poor. Further, a problem also arises that a control follow-up characteristic is degraded.

Further, according to the MRI apparatus disclosed in Japanese Patent Application Laid-Open No. 63-278310, the sheet-like startup heaters are respectively placed on the upper surface of the upper base yoke and the lower surface of the lower base yoke.

However, a problem arises that if the heaters are mounted on the upper surface of the upper base yoke, heat is dissipated upward and hence thermal efficiency becomes poor. Further, a problem also arises that the attachment of the heaters to the lower surface of the lower base yoke provides bad workability.

SUMMARY OF THE INVENTION

With the foregoing in view, it is therefore an object of the present invention to provide a magnet assembly suitable for use in an MRI apparatus, which is capable of improving thermal efficiency, a control follow-up characteristic and workability and suitably suppressing the influence of temperature on a static magnetic field.

According to a first aspect of the present invention, there is provided a magnet assembly suitable for use in an MRI apparatus, comprising:

permanent magnets respectively provided upward and downward in a space with a body to be examined placed therein;

base yokes respectively provided upward and downward so as to correspond to the permanent magnets, the base yokes comprising an upper base yoke having a lower surface to which the permanent magnet provided upward in the space is attached and a lower base yoke having an upper surface to which the permanent magnet provided downward in the space is attached;

columnar yokes provided between the upper base yoke and the lower base yoke so as to ensure the space for placing the body therein;

temperature detecting means for detecting temperatures of the permanent magnets;

heater means attached directly or via thermal transfer materials other than gases to sides of the base yokes to heat the permanent magnets; and temperature control means for controlling the heater means based on the temperatures detected by the temperature detecting means.

According to a second aspect of the present invention, there is provided a magnet assembly for an MRI apparatus, wherein the temperature detecting means is provided in the vicinity of the center of an upper surface of the upper base yoke.

In the magnet assembly for the MRI apparatus, according to the first aspect of the present invention, the heater means are respectively attached directly or via the thermal transfer materials other than gases to the sides of the upper and lower base yokes.

Since the yokes are heated by the heat transfer without being through air, thermal efficiency becomes good. Further, a control follow-up characteristic is also improved. Since heat is dissipated into the side but not dissipated upward, losses are less produced. Even in this point, the thermal efficiency is improved. Further, since no heater means are provided under the lower base yoke, workability can be improved.

In the magnet assembly for the MRI apparatus, according to the second aspect, temperature detecting means is provided in the vicinity of the center of an upper surface of an upper base yoke.

In this case, the distance between the heater means and the temperature detecting means falls within a range of approximately 0.5 m to 1 m. However, if the distance therebetween falls within the range in this way, a delay in the transfer of heat from the heater means to the temperature detecting means is made suitable. It is therefore possible to avoid the frequent turning on/off of the heater means, which occurs when the distance therebetween is extremely short and avoid a delay in follow-up, which occurs when the distance therebetween is overlong.

The above and other objects, features and advantages of the present invention will become apparent from the following description and the appended claims, taken in conjunction with the accompanying drawings in which a preferred embodiment of the present invention is shown by way of illustrative example.

BRIEF DESCRIPTION OF THE DRAWINGS

The present invention will be described with reference to the accompanying drawings in which.

DETAILED DESCRIPTION OF THE PREFERRED EMBODIMENT

The present invention will hereinafter be described in further detail by a preferred embodiment. Incidentally, the present invention is not limited to or by the embodiment.

Figure 1:
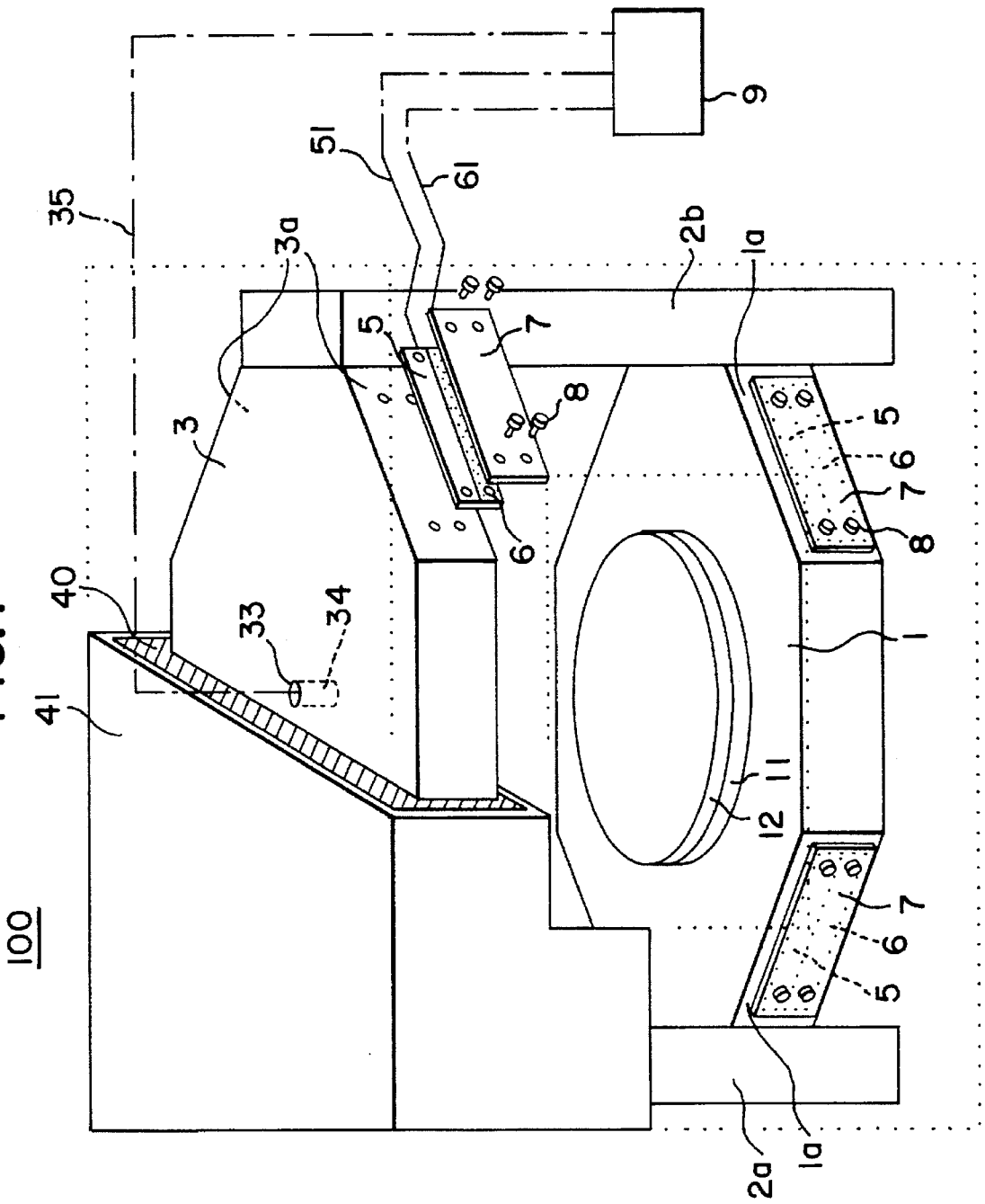
FIG. 1 is a perspective view showing components of a magnetic circuit of a magnet assembly employed in an MRI apparatus according to one embodiment of the present invention.
Figure 2:
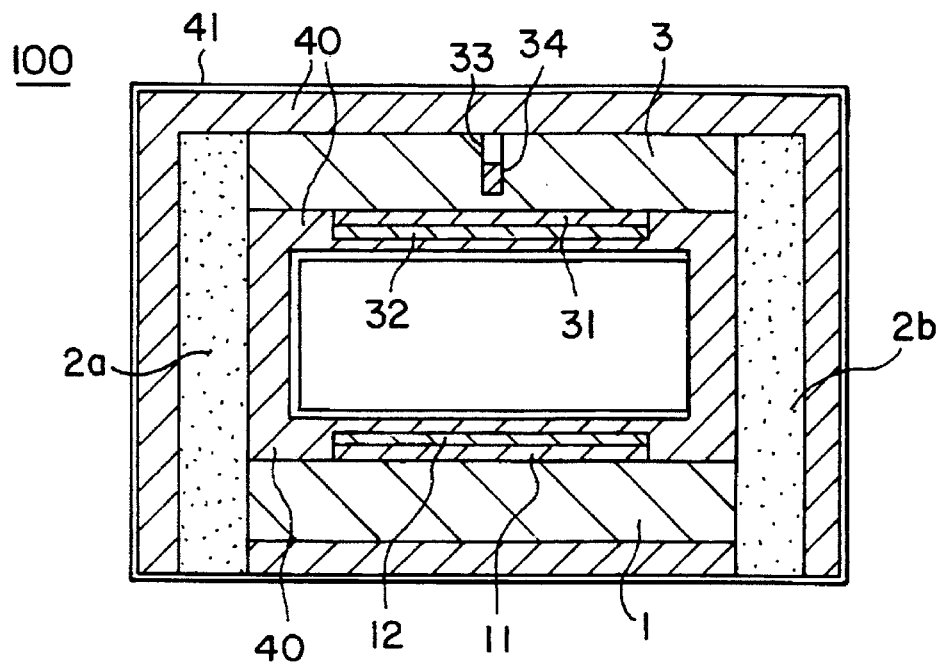
FIG. 2 is a central sectional view of the magnet assembly of the MRI apparatus shown in FIG. 1.

FIG. 1 is a perspective view showing components that constitute a magnetic circuit of a magnet assembly 100 employed in an MRI apparatus according to one embodiment of the present invention. FIG. 2 is a cross-sectional view of the magnet assembly shown in FIG. 1.

Reference numeral 1 indicates a lower base yoke shaped in the form of an octagonal prism, which is supported by columnar yokes 2a and 2b at both sides thereof opposed to each other. Similarly, an upper base yoke 3 shaped in the form of an octagonal prism is also supported by the columnar yokes 2a and 2b at both sides thereof opposed to each other.

A lower permanent magnet 11 and a magnetic shunt plate 12 are attached to the upper surface of the lower base yoke 1.

Further, an upper permanent magnet 31 and a magnetic shunt plate 32 are mounted onto the lower surface of the upper base yoke 3 so as to be opposed to the lower permanent magnet 11 and the magnetic shunt plate 12 (see FIG. 2).

Reference numeral 40 indicates a heat insulating material for closely covering the lower base yoke 1, the columnar yokes 2a and 2b and the upper base yoke 3 (only part thereof is illustrated in FIG. 1). Reference numeral 41 indicates an enclosure (only part thereof is illustrated in FIG. 1).

The heat insulating material 40 makes use of, for example, vasotect (trade name; product of INOAC CORPORATION). As the heat insulating material 40, may be used others such as polyisocyanate foam, fire retardant polystyrene foam, fire retardant polyurethane foam, rigid urethane foam, etc.

AC sheet heaters 5 and DC sheet heaters 6 are respectively upwardly and downwardly parallel-fixed to side faces 1a of the lower base yoke 1 at side face intervals. The fixing of these heaters onto each side face is performed by covering the AC sheet heater 5 and the DC sheet heater 6 with a fixing bake plate 7 from above and fastening or tightening them by bolts 8. Silicone grease is filled between each side face 1a of the lower base yoke 1 and the AC and DC sheet heaters 5 and 6 in order to improve a heat transfer characteristic.

Similarly, AC sheet heaters 5 and DC sheet heaters 6 are respectively upwardly and downwardly parallel-fixed to side faces 3a of the upper base yoke 3 at side face intervals. They are fixed to each side face 3a by covering the AC sheet heater 5 and the DC sheet heater 6 with a fixing bake plate 7 from above and tightening them by bolts 8. Further, silicone grease is filled between each side face 3a of the upper base yoke 3 and the AC and DC sheet heaters 5 and 6 in order to improve the heat transfer characteristic.

Figure 3A:
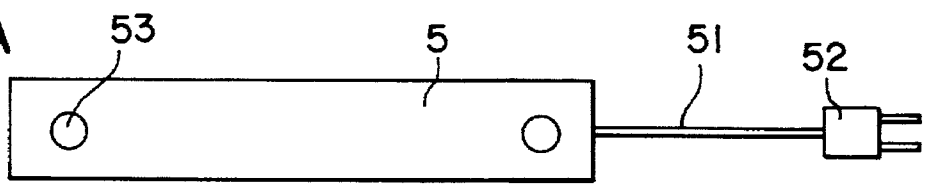
FIG. 3(a) is a plan view showing an AC sheet heater.

FIG. 3(a) is a plan view of the AC sheet heater 5.

The AC sheet heater 5 is designed for an AC 200 V (120 W) and used as a start-up heater. The plan dimensions of the AC sheet heater 5 are 25 mm×150 mm. Reference numeral 51 indicates an electric supply line or feeder. Reference numeral 52 indicates a connector. Designated at numerals 53 are bolt bores.

Figure 3B:
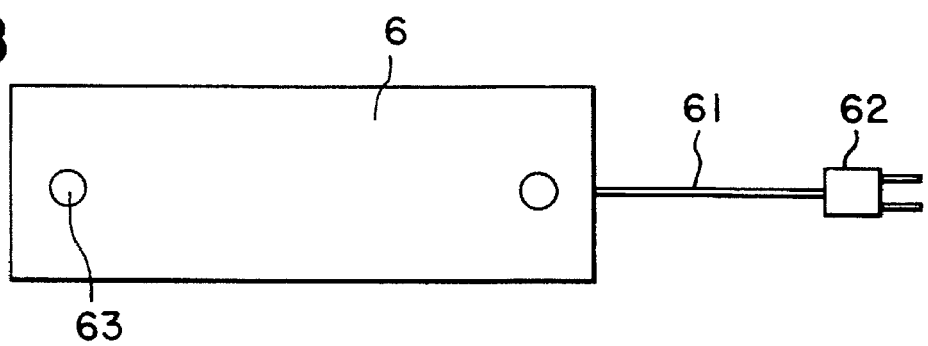
FIG. 3(b) is a plan view showing a DC sheet heater.

FIG. 3(b) is a plan view of the DC sheet heater 6.

The DC sheet heater 6 is designed for a DC 48 V (30 W) and also used as a start-up heater but principally as a steady-temperature adjusting heater. The plan dimensions of the DC sheet heater 6 are 50 mm×150 mm. Reference numeral 61 indicates an electric supply line. Reference numeral 62 indicates a connector. Designated at numerals 63 are bolt bores.

Referring back to FIG. 1, a bore 33 is defined in the center of the upper base yoke 3. A temperature sensor 34 is inserted into the bore 33. After the temperature sensor 34 has been inserted into the bore 33, the bore is filled with the silicone grease so as to be sealed. Reference numeral 35 indicates a signal line used for the temperature sensor 34.

The electric supply lines 51 and 61 and the signal line 33 are electrically connected to a temperature control circuit 9.

Figure 4:
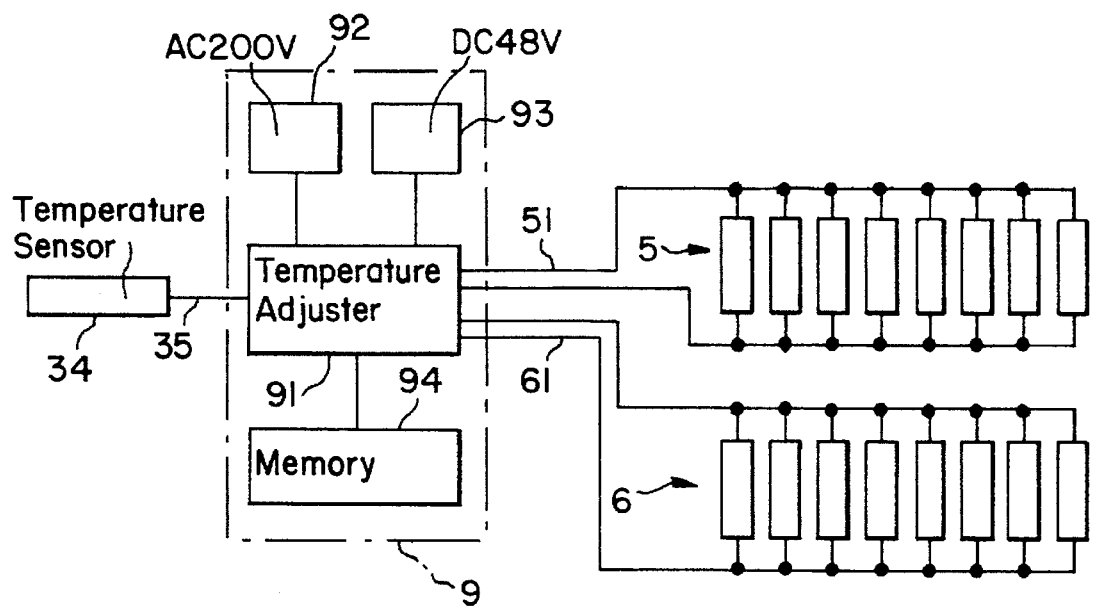
FIG. 4 is a view illustrating the structure of a temperature control circuit shown in FIG. 1.

As shown in FIG. 4, the temperature control circuit 9 comprises a temperature adjuster 91 for adjusting the supply of power to the AC and DC sheet heaters 5 and 6, an AC source 92 for supplying power to each AC sheet heater 5, a DC supply 93 for supplying power to each DC sheet heater 6 and a memory 94 in which an intended upper-limit temperature and an intended lower-limit temperature have been stored.

Figure 5:
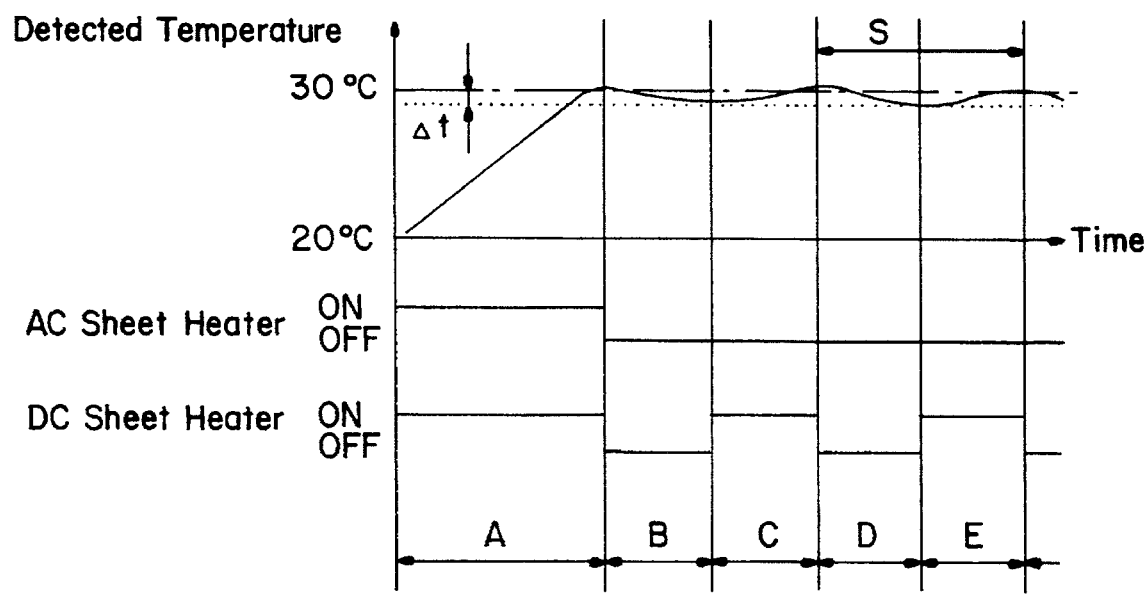
FIG. 5 is a view for describing a temperature control procedure.

FIG. 5 is a view for explaining a temperature control procedure.

Upon start-up of the magnet assembly 100 of the MRI apparatus, the AC sheet heaters 5 and the DC sheet heaters 6 are energized, so that the temperature sensor 34 starts to detect the temperatures thereof (zone A). Heat is transferred from the AC and DC sheet heaters 5 and 6 to the lower permanent magnet 11 through the lower base yoke 1. Further, the heat is transferred to the upper permanent magnet 31 through the upper base yoke 3.

The temperature adjuster 91 detects an intended upper-limit temperature (e.g., 30° C.) using the temperature sensor 34 and thereafter stops the supply of power to the AC and DC sheet heaters 5 and 6 (zone B).

Next, the temperature adjuster 91 applies power to each DC sheet heater 6 alone after having detected an intended lower-limit temperature (e.g., 30°-Δt) using the temperature sensor 34 (zone C).

Further, the temperature adjuster 91 de-energizes each DC sheet heater 6 after having detected the intended upper-limit temperature using the temperature sensor 34 (zone D).

Subsequently, the temperature adjuster 91 on-off controls the supply of the power to each DC sheet heater 6 in the same manner as described above (zone E).

The magnet assembly 100 of the aforementioned MRI apparatus can bring about the following advantageous effects.

(1) Since the upper permanent magnet 31 and the lower permanent magnet 11 are heated without via air, thermal efficiency is improved. Further, a control follow-up characteristic is also improved.

(2) Since the pairs of the AC sheet heaters 5 and the DC sheet heaters 6 are respectively attached to the side faces of the lower base yoke 1 and the upper base yoke 3, heat that produces a large loss, is prevented from escaping upward and hence the thermal efficiency is improved.

(3) Since no heater is provided on the lower surface of the lower base yoke 1, an improvement in workability can be achieved.

(4) Since each AC sheet heater 5 whose amount of heat generated is large, is used jointly upon startup, a start-up time can be shortened. The magnet assembly of the conventional MRI apparatus needs 24 hours or more to increase the room temperature (about 20° C.) up to the intended upper-limit temperature (30° C.), for example. However, the time necessary for its increase may be about 12 hours or less in the case of the magnet assembly 100 of the MRI apparatus according to the present invention.

(5) Since the steady temperature adjustment is done by the DC sheet heaters 6 excellent in temperature control characteristic, the control follow-up characteristic is good.

(6) Since the temperature sensor 34 is provided in the vicinity of the center of the upper surface of the upper base yoke 3, a heat-transfer time delay is made suitable and hence a temperature control interval (corresponding to S in FIG. 5) is rendered appropriate. Namely, the control follow-up characteristic can be prevented from becoming more sensitive or insensitive than required.

(7) Since the lower base yoke 1 and the upper base yoke 3 are covered with the heat insulating material 40 together with the AC and DC sheet heaters 5 and 6 without any space, the difference between the upper and lower temperatures due to the convection of air can be prevented from occurring. Further, since the heat insulating material 40 can be kept in intimate contact with the lower base yoke 1 and the upper base yoke 3, the enclosure 41 for covering the lower base yoke 1 and the upper base yoke 3 can be thinned.

(8) Since the AC sheet heaters 5 and the DC sheet heaters 6 are kept in absolute contact with the lower base yoke 1 and the upper base yoke 3 using the fixing bake plates 7, the efficiency of heat transfer is excellent.

Many widely different embodiments of the present invention may be constructed without departing from the spirit and scope of the present invention. It should be understood that the present invention is not limited to the specific embodiments described in the specification, except as defined in the appended claims.

What is claimed is:

1. A magnet assembly suitable for use in an MRI apparatus, comprising:

a pair of permanent magnets provided respectively above and below a space wherein a body to be examined is placed;

an upper base yoke and a lower base yoke provided respectively above and below said space and corresponding to said pair of permanent magnets, said upper base yoke having a lower surface to which one of said pair of permanent magnets is attached, and said lower base yoke having an upper surface to which the other of said pair of permanent magnets is attached, and wherein said upper base yoke and said lower base yoke each has side surfaces;

a plurality of columnar yokes disposed between said upper base yoke and said lower base yoke to define said space;

temperature detecting means for detecting temperatures of said pair of permanent magnets;

heater means attached to at least one of said side surfaces of at least one of said upper and lower base yokes for heating said pair of permanent magnets; and temperature control means for controlling said heater means based on temperatures detected by said temperature detecting means.

2. A magnet assembly according to claim 1, further comprising a heat insulating material for covering said upper and lower base yokes, and said plurality of columnar yokes.

3. A magnet assembly according to claim 1, wherein said temperature detecting means is provided in the vicinity of a center of an upper surface of the upper base yoke.

4. A magnet assembly according to claim 1, wherein said heater means comprise AC heaters supplied with alternating current so as to generate heat and DC heaters supplied with direct current so as to generate heat.

5. A magnet assembly according to claim 4, wherein said permanent magnets are heated by the AC heaters during a period in which said permanent magnets reach predetermined temperatures after their heating and are heated by the DC heaters after said permanent magnets have reached the predetermined temperatures.

6. The magnetic assembly of claim 1, wherein said upper base yoke and said lower base yoke have upper and lower surfaces, respectively, defined in an octagonal shape.

7. The assembly of claim 1, wherein said heater means are attached directly to said at least one of said side surfaces of said at least one of said upper and lower base yokes.

8. The magnetic assembly of claim 1, wherein said heater means are attached via a transfer material other than a gas to said at least one of said side surfaces of said at least one of said upper and lower base yokes.

9. The magnetic assembly of claim 1, wherein said heater means are attached to at least one of said side surfaces of both said upper and lower base yokes.

* * * * *